United States Patent [19]

Nakagawa et al.

[11] Patent Number: 5,296,414
[45] Date of Patent: Mar. 22, 1994

[54] PARTIALLY CRYSTALLIZABLE LOW MELTING GLASS

[75] Inventors: Seiichi Nakagawa, Tokyo; Kuninori Okamoto, Kanagawa, both of Japan; Barry E. Taylor, Wake Forest, N.C.; Motohiko Tsuchiya, Tokyo, Japan

[73] Assignee: E. I. Du Pont de Nemours and Company, Wilmington, Del.

[21] Appl. No.: 995,759

[22] Filed: Dec. 23, 1992

[30] Foreign Application Priority Data

Jan. 8, 1992 [JP] Japan ................. 3-300751

[51] Int. Cl.$^5$ ............ C03C 8/16; C03C 10/02; C03C 8/14
[52] U.S. Cl. ....................... 501/20; 501/10; 501/17
[58] Field of Search ............... 501/17, 10, 20

[56] References Cited

U.S. PATENT DOCUMENTS

| 3,088,835 | 5/1963 | Pirooz | 501/76 |
| 3,113,878 | 12/1963 | Martin | 501/5 |
| 3,936,397 | 2/1976 | Rapp | 252/518 |
| 4,536,435 | 8/1985 | Utsumi et al. | 428/209 |
| 5,114,885 | 5/1992 | Hormadaly | 501/76 |
| 5,137,851 | 8/1992 | Hormadaly and Taylor | 501/76 |

FOREIGN PATENT DOCUMENTS 616018 6/1976 Japan .

OTHER PUBLICATIONS

*Derwent Publications Ltd.,* Accession No. 78-111-18A/06, Feb. '86.
*Chemical Abstracts,* vol. 89, 1978, abstract No. 29552e, p. 322.
*Glastechnische Berichte,* vol. 62, No. 5, May, 1989, pp. 187-189, W. K. Park et al., "Glass Ceramics of the System Pb($Zr_{0.5}Ti_{0.5}$)$O_3$-$GeO_2$".

*Primary Examiner*—Mark L. Bell
*Assistant Examiner*—David R. Sample

[57] ABSTRACT

A crystallizable low melting glass consisting essentially of PbO, ZnO, $B_2O_3$, $GeO_2$ and optionally $SiO_2$, $SnO_2$ and a metal oxide colorant.

5 Claims, No Drawings

5,296,414

PARTIALLY CRYSTALLIZABLE LOW MELTING GLASS

FIELD OF THE INVENTION

The invention relates to a crystallizable low melting glass composition and, in particular, relates to such glasses which are suitable for coating thick film electronic circuits.

BACKGROUND OF THE INVENTION

It is widely practiced in the electronics industry to form electronic circuits by printing and firing thick film pastes. Such pastes are usually dispersions of finely divided particles of conductive metals and inorganic binder (glass frit) in an organic medium comprising a solid organic polymer dissolved in a volatilizable solvent. When circuits prepared in this manner are located on the outside of the electronic device, it is desirable to protect them from abrasion during handling and from environmental hazards by covering them with a coating of low melting glass. Such circuits may be either conductive or resistive in electrical functionality. Conventionally, the glass used for such applications has been an amorphous lead borate-type glass.

However, a recent trend toward the use of higher density circuitry has resulted in a demand for finer lines and spaces between the conductor lines. This, in turn, has exacerbated the problem of the generation of mechanical stresses in such structures because of the differences in the coefficients of thermal expansion (TCE) between the substrate and the printed and fired resistor or conductor. These higher stresses are exhibited by the appearance of microcracks which change the electrical properties of the functional layer. Thus, the resistance of a fired thick film resistor would be changed substantially by the presence of very small cracks in the printer and fired resistor layer. For this reason, there has been a substantial need for a way to suppress the formation of these mechanical stresses and thus to avoid unwanted changes in the resistance values of printed electronic circuits.

SUMMARY OF THE INVENTION

The invention is therefore directed in a first aspect to a crystallizable low melting glass consisting essentially by weight of 31–49% PbO, 35–50% ZnO, 15–20% $B_2O_3$ and either 3–10% $GeO_2$ or 2–10% of a solid solution of $GeO_2$ and $SiO_2$.

In a second aspect, the invention is directed to dispersions of finely divided particles of the above-described glass or its compositional equivalent mixture of metal oxides in an organic medium containing a solvent and an organic polymer binder. By adjustment of the volatility of the solvent and the rheological properties of the dispersion, the composition of the invention can be used to form a green tape or it can applied as a printable thick film paste.

PRIOR ART

The closest prior art of which applicants are aware at the time of filing this application is the following:

U.S. Pat. No. 3,088,835, Pirooz

The Pirooz patent is directed to a crystallizable sealing glass composition containing 38–42% ZnO, 10–14% $SiO_2$, 11–29% wt. PbO, 9–13% copper oxide, and up to 5% wt. of other glass forming oxides such as $B_2O_3$. The copper oxide is indicated to be essential for the purpose of adjusting the temperature coefficient of expansion of the composition.

U.S. Pat. No. 3,113,878, Martin

The Martin patent is directed to a crystallizable zinc silicoborate glass consisting of 60–70% ZnO, 19–25% $B_2O_3$ and 10–16% $SiO_2$ and optionally "minor amounts" of glass forming materials such as PbO, $As_2O_3$ and $Sb_2O_3$ and colorants. In particular, a glass is disclosed containing 60% ZnO, 22.5% $B_2O_3$, 12.5% $SiO_2$ and 5% PbO (Example 7). The glass is disclosed to be useful as a sealing glass for preformed materials having a Temperature Coefficient of Expansion (TCE) of $20\text{-}50 \times 10^{-7}/°C$.

U.S. Pat. No. 5,114,885, Hormadaly

The Hormadaly —885 patent is directed to a crystallizable glass composition consisting of by weight 15–34.5% ZnO, 41–65% PbO, 10–30% $B_2O_3$, 0.5–15% $SiO_2$, 0.5–10% $SnO_2$ and 0–7% $Al_2O_3$, $Cr_2O_3$ or mixtures thereof, the TCE being at least $57.9 \times 10^{-7}/°C$. upon firing at 510°–560° C.

U.S. Pat. No. 5,137,851, Hormadaly and Taylor

The Hormadaly —851 et al. patent is directed to a low-melting crystallizable glass composition consisting essentially of 30–40% PbO, $Bi_2O_3$ or mixtures thereof, 35–50% ZnO, 10–30% $B_2O_3$, 0.5–3% chromium oxide, 0.5–10% $SnO_2$, 0.5–10% $SiO_2$ and 0–10% $Al_2O_3$, the ratio of $Cr^{6+}$ to $Cr^{3+}$ in the chromium oxide being sufficient that the optical density parameter of the glass is at least 1.6

Japanese Kokai 61/6018, assigned to Asahi Glass

The patent is directed to a crystalline glass having a low melting point with the following composition by weight: 31–40% PbO, 35–50% ZnO, 10–20% $B_2O_3$, 2–6% $SiO_2$, 0–3% $SnO_2$ and 0–4% $TiO_2$. The glass is completely crystallized within 30 minutes upon heating to 500°–600° C. The crystallized product has a TCE of $43\text{-}55 \times 10^{-7}$ per °C. The glass is disclosed to be useful as a cover for thick film circuits. It is disclosed to be applied as a paste by printing or brushing.

DETAILED DESCRIPTION OF THE INVENTION

The present invention relates to a crystalline low melting glass suitable for cover coating (encapsulating) a thick film electronic circuit, more specifically to a crystallizable low melting glass for cover coating which will suppress change in the resistance values of the thick film electronic circuit with which it is used.

As is known in the art, thick film electronic circuits are formed by printing a conductor paste, a resistor, or the like, on a ceramic baseboard, firing them and forming a glass cover on the baseboard surface to protect the electronic circuit. The conventional cover coating glass for such an electronic circuit uses a $PbO\text{-}B_2O_3$ type amorphous low crystallinity glass.

However, the recent trends towards higher density formation of thick film electronic circuits have been causing each of the resistors and conductors used to become smaller. This has resulted in increased generation of mechanical stress in a printed, fired resistor caused by the difference in the coefficients of thermal expansion between the substrate and the printed, fired resistor, with the result that microcracks are generated in the resistor on firing, consequently creating the problem of changing the resistance value of the resistor.

The task of this invention is to provide a glass suitable for cover coating a thick film electronic circuit which suppresses those stresses which cause microcracking and a change in the resistance value of the thick film electronic circuit.

The present invention is comprised of a crystalline low melting glass comprising 31-49% by weight of PbO, 35-50% by weight of ZnO, and 15-20% by weight of $B_2O_3$ and either 3-10% by weight of $GeO_2$ alone, or 2-10% by weight of a mixed solution of $GeO_2$ and $SiO_2$.

The oxide composition necessary for obtaining a low melting glass having a crystalline phase, $PbZn_2B_2O_6$ should comprise PbO: 48.98% by weight, ZnO: 35.71% by weight, and $B_2O_3$: 15.30% by weight. Basically, the use of the above compositional ratio is preferred for reaching such a crystalline phase. However, the use of these three elements alone for application in cover coating glass will result in the devitrification of the glass, causing a problem in carrying out laser trimming of the resistor underneath. It is therefore necessary to reinforce the glass network and to crystallize the glass partially and to suppress excess crystallization.

The present invention successfully suppresses that crystallization and devitrification by addition of $GeO_2$. A similar effect can also be obtained with a blend of $GeO_2$ and $SiO_2$. Thus, the four elements (or five elements in the case of a blended system of $SiO_2$ and $GeO_2$), are used as main components, optionally with the addition of a pigment such as $Cr_2O_3$ to color the glass. A metal oxide such as $SnO_2$, or the like, may also be added to improve water resistance. In general, the melting point of a crystalline glass is higher in temperature than the melting point of an amorphous glass. However, the observation of a rise in the crystallization temperature on increasing the amount of $GeO_2$, by a differential scanning calorimetric measurement of the rate of crystallization of a $PbO$-$ZnO$-$B_2O_3$-$GeO_2$ system glass powder, led to the discovery that the glass composition of this invention can be fired at 500-600 C.

ZnO in the above composition, which is an essential element for crystalizing the glass, also develops crystalline phases such as $ZnSnO_3$ and $Zn_2SnO_4$ because of its reactivity. Therefore, it must be used in excess of the calculated value (35.71% by weight) to insure the formation of the goal $PbZn_2B_2O_6$ crystalline phase. However, a level above about 50% by weight begins to extremely accelerate crystallization, so that the usable range is 35-50% by weight.

The amount of PbO can be smaller than the calculated value because ZnO is consumed in forming a crystalline phase other than $PbZn_2B_2O_6$; however, a level of 31% by weight or less will cause the glass crystallization temperature to be too high to be preferred.

The smaller the level of B2O3 the better for improving moisture resistance because it readily reacts with water even when present in a glass. However, as it also acts as a flux for decreasing the melting point, the preferred range is 15-20% by weight over the glass use temperature range in this invention.

A weight ratio of 3-10% by weight of $GeO_2$ is necessary for providing a crystallization suppressing effect, so as to reach an optimal degree of crystallization and clarity. The weight ratio in terms of the number of moles translates into 0.03-0.10 moles (in the case of 100 g of glass). A $GeO_2/SiO_2$ blend system also may be used when the total amount has the same number of moles, which in terms of percent by weight gives a usable total weight of 2-10% by weight.

The preparation of such a cover coat glass for a thick film electronic circuit calls for generating a batch by mixing the starting materials for each component, heating to melt at 1,000°-1,400° C. for 1-2 hours, water-quenching the resultant melted glass, pulverizing to an average particle size of about 2 μm by a pulverizer, thereby generating a powdery glass. The resultant powdery glass is mixed with a solvent and a vehicle to give a paste which is screen printed onto a thick film electronic circuit, dried and fired at 500°-600° C. for melting and crystallization.

The change in the resistance value in a thick film electronic circuit can be suppressed by preventing microcracks from forming in the resistor. The crystalline glass of this invention, which has a smaller coefficient of thermal expansion, if used for covering a thick film electronic circuit, can suppress the concentration of stresses resulting from the thermal expansion of the baseboard, thereby permitting the prevention of microcrack formation in the resistor.

The surface area of the glass particles is not critical but is preferably in the range of 0.75-4 $m^2/g$. Assuming a density of approximately 3-4 $g/cm^2$, this range corresponds to an approximate particle size range of 0.5-1 micron. A surface area of 1.5 $m^2/g$ (approx. 1.3 micron) can also be utilized. The preparation of such glass frits is well known and consists, for example, in melting together the constituents of the glass in the form of the oxides of the constitutents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, zinc oxide will be produced from zinc carbonate, etc. The glass is preferably milled in a ball mill with water to reduce the particle size of the frit and to obtain a frit of substantially uniform size.

Organic Medium

Organic media suitable for use in the invention are selected according to the physical form in which the encapsulant compositions are applied. In particular, the encapsulant glass frit can be applied as a thick film paste by screen printing.

When the encapsulant is applied by screen printing, the particles thereof are mixed with an inert liquid medium (vehicle) by mechanical mixing (e.g., on a roll mill) to form a pastelike composition having suitable consistency and rheology for screen printing. The latter is printed as a "thick film" in the conventional manner.

The main purpose of the organic medium is to serve as a vehicle for dispersion of the finely divided solids of the composition in such form that it can readily be applied to ceramic or other substrates. Thus the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of liquids can be used as organic medium. The organic medium for most thick film compositions is typically a solution of resin in a solvent frequently also containing thixotropic agents and wetting agents. The solvents usually boil within the range of 130°-350° C.

Suitable solvents include kerosene, mineral spirits, dibutylphthalate, butyl carbitol, butyl carbitol acetate, hexylene glycol and high boiling alcohols and alcohol esters. Various combinations of these and other solvents are formulated to obtain the desired viscosity and volatility.

By far the most frequently used and a frequently preferred resin for this purpose is ethyl cellulose. However, resins such as ethylhydroxyethyl cellulose, wood rosin, mixtures of ethyl cellulose and phenolic resins, polymethacrylates of lower alcohols and monobutyl ether of ethylene glycol monoacetate can also be used.

Among the thixotropic agents which are commonly used as hydrogenated castor oil and derivatives thereof and ethyl cellulose. It is, of course, not always necessary to incorporate a thixotropic agent since the solvent resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used. Normally, to achieve good coverage, the dispersions will contain complementally by weight 40-90% solids and 60-10% organic medium.

EXAMPLES

Examples 1-13

Observation of Devitrification Properties

Thirteen thick film pastes were prepared from glass powders having an average particle size of 2 microns by admixing and roll milling each of them with an organic medium comprising ethyl cellulose dissolved in alpha terpineol. Nine of the pastes (Examples 1-9) contained glasses in accordance with the invention while the other four (Examples 10-13) were control samples for comparison. Samples of each of the pastes were printed onto an alumina substrate having a TCE of $60 \times 10^{-7}/°C$. (50°-350° C.) and dried. The dried pieces were then fired at a peak temperature of 500°-600° C. after which the fired sample layers were examined with a scanning electron microscope (SEM) to determine whether devitrification (crystallization) of the glasses had taken place during firing. Devitrification is evidenced by the appearance of crystal formations which cause lack of transparency of the glass. The composition and devitrification character of each of the glasses are given in Table 1 below:

TABLE 1

Glass Compositions and Devitrification Properties

| Composition | Example No. | | | | |
|---|---|---|---|---|---|
| | 1 | 2 | 3 | 4 | 5 |
| | % Wt. | | | | |
| PbO | 37.45 | 37.27 | 37.07 | 36.89 | 36.70 |
| $B_2O_3$ | 16.93 | 16.85 | 16.77 | 16.68 | 16.60 |
| ZnO | 37.36 | 37.18 | 36.99 | 36.80 | 36.61 |
| $SnO_2$ | 2.84 | 2.83 | 2.81 | 2.80 | 2.79 |
| $Cr_2O_3$ | 1.10 | 1.10 | 1.10 | 1.10 | 1.10 |
| $GeO_2$ | 1.42 | 1.89 | 2.37 | 2.84 | 3.31 |
| $SiO_2$ | 1.39 | 1.39 | 1.39 | 1.39 | 1.39 |
| CdO | — | — | — | — | — |
| Devitrification | Yes | Yes | Yes | Yes | Yes |

| Composition | Example No. | | | | |
|---|---|---|---|---|---|
| | 6 | 7 | 8 | 9 | 10 |
| | % Wt. | | | | |
| PbO | 37.27 | 37.27 | 37.27 | 37.27 | 37.27 |
| $B_2O_3$ | 16.85 | 16.85 | 16.85 | 16.85 | 16.85 |
| ZnO | 37.18 | 37.18 | 37.18 | 37.18 | 37.18 |
| $SnO_2$ | 2.83 | 2.83 | 2.83 | 2.83 | 2.83 |
| $Cr_2O_3$ | 1.10 | 1.10 | 1.10 | 1.10 | 1.10 |
| $GeO_2$ | 4.30 | 6.00 | 2.37 | 4.30 | — |
| $SiO_2$ | — | — | 1.39 | 1.39 | — |
| CdO | — | — | — | — | — |
| Devitrification | Yes | Yes | Yes | Yes | No |

| Composition | Example No. | | |
|---|---|---|---|
| | 11 | 12 | 13 |
| | % Wt. | | |
| PbO | 37.37 | 37.27 | 60.4 |
| $B_2O_3$ | 16.85 | 16.85 | 11.4 |
| ZnO | 37.18 | 37.18 | — |
| $SnO_2$ | 2.83 | 2.83 | — |
| $Cr_2O_3$ | 1.10 | 1.10 | 1.8 |
| $GeO_2$ | 2.37 | — | — |
| $SiO_2$ | — | 1.39 | — |
| CdO | — | — | 8.2 |
| Devitrification | No | No | No |

The above data show that all of the invention glasses exhibited crystallization, but none of the control glasses did.

EXAMPLES 14 and 15

Rate of Change of Resistance Values

A further thick film paste was prepared from a glass having the same composition as the glass of Example 2 to which was added 1.10% by weight $Cr_2O_3$. This paste and a further quantity of paste prepared as described hereinabove from the glass of Example 13 were each screen printed onto an alumina substrate containing a fired conductor pattern and an overlying fired resistor pattern. Three sizes of resistors were used: 0.8×0.8 mm, 1.0×1.0 mm and 2.0×2.0 mm. Ten of each size were used to measure resistor values which ranged from 1.5 to 1M ohms/square. Intermediate values were 3.0, 10, 100, 1K, 10K and 100K ohms/square.

Each of the test pieces was tested with a cold-hot temperature cycle of −40° C. to 150° C. for up to 1,000 cycles, after which the change of resistance values was measured. Each cycle of heating and cooling took one hour with equal time from one temperature extreme to the other. The results of these measurements are given in Table 2 below which shows the number of resistors in each set of ten in which the change of resistance values was at least 1%. The data show clearly that the glasses of the invention upon crystallization gave consistently good results over the entire range of resistance values after undergoing −40° to 150° C. temperature cycling for 1000 hours.

TABLE 2

| Resistor | Cool Heat Cycle (−40 ~ 150° C.) 1000 Hours | | | | | |
|---|---|---|---|---|---|---|
| | Example 2 | | | Control Example 4 | | |
| Dimension | 0.8 mm | 1.0 mm | 2.0 mm | 0.8 mm | 1.0 mm | 2.0 mm |
| Measured Resistance Values (ohms/square) | | | | | | |
| 1.5 | 0 | 0 | 0 | 5 | 3 | 4 |
| 3.0 | 0 | 0 | 0 | 1 | 1 | 0 |
| 10 | 0 | 0 | 0 | 8 | 8 | 4 |
| 100 | 0 | 0 | 0 | 0 | 0 | 0 |
| 1K | 0 | 0 | 0 | 0 | 0 | 0 |
| 10K | 0 | 0 | 0 | 0 | 0 | 0 |
| 100K | 0 | 0 | 0 | 0 | 0 | 0 |
| 1M | 0 | 0 | 0 | 0 | 0 | 0 |

EXAMPLES 16 AND 17

Effect of Humidity and High Temperature Storage

Identical sets of test pieces as were used in Examples 14 and 15 were prepared and subjected to exposure for 1000 hours at 150° C. and also at 85° C. in an atmosphere of 85% humidity. The results of these tests are given in Tables 3 and 4 which show that the pastes containing the glass of the invention allowed essentially no change in resistance values throughout the testing conditions for both low and high resistance resistors. On the other hand, the pastes containing the control glass were considerably less effective for the low resistance resistors (1.5–10 ohms/square).

TABLE 3

| Resistor | Standing at High Temperature (150° C.) 1000 Hours | | | | | |
|---|---|---|---|---|---|---|
| | Example 2 | | | Control Example 4 | | |
| Dimension | 0.8 mm | 1.0 mm | 2.0 mm | 0.8 mm | 1.0 mm | 2.0 mm |
| Measured Resistance Values (ohms/square) | | | | | | |
| 1.5 | 0 | 0 | 0 | 8 | 9 | 10 |
| 3.0 | 0 | 0 | 0 | 0 | 0 | 0 |
| 10 | 0 | 0 | 0 | 1 | 0 | 0 |
| 100 | 0 | 0 | 0 | 0 | 0 | 0 |
| 1K | 0 | 0 | 0 | 0 | 0 | 0 |
| 10K | 0 | 0 | 0 | 0 | 0 | 0 |
| 100K | 0 | 0 | 0 | 0 | 0 | 0 |
| 1M | 0 | 0 | 0 | 0 | 0 | 0 |

TABLE 4

| Resistor | High Temperature, High Humidity (85° C.–85%) 1000 Hours | | | | | |
|---|---|---|---|---|---|---|
| | Example 2 | | | Control Example 4 | | |
| Dimension | 0.8 mm | 1.0 mm | 2.0 mm | 0.8 mm | 1.0 mm | 2.0 mm |
| Measured Resistance Values (ohms/square) | | | | | | |
| 1.5 | 0 | 0 | 0 | 6 | 7 | 9 |
| 3.0 | 0 | 0 | 0 | 1 | 1 | 0 |
| 10 | 0 | 0 | 0 | 0 | 0 | 0 |
| 100 | 0 | 0 | 0 | 0 | 0 | 0 |
| 1K | 0 | 0 | 0 | 0 | 0 | 0 |
| 10K | 0 | 0 | 0 | 0 | 0 | 0 |
| 100K | 0 | 0 | 0 | 0 | 0 | 0 |
| 1M | 0 | 0 | 0 | 0 | 0 | 0 |

From the foregoing examples it is clear that the use of the crystallizable low melting glasses as encapsulants for thick film electronic circuits effectively suppresses any change in resistance values under a wide variety of operational conditions.

We claim:

1. A crystallizable low melting glass consisting essentially by weight of 31–49% PbO, 35–50% ZnO, 15–20% $B_2O_3$, 0.1–10% $GeO_2$, 0–9.9% $SiO_2$, 0–3% $SnO_2$ and 0–3% of a metal oxide colorant with the proviso that in the absence of $SiO_2$ from 3 to 10% by weight $GeO_2$ is present or from 2 to 10% by weight of a mixed solution of $GeO_2$ and $SiO_2$ is present.

2. The glass of claim 1 which contains 2–10% of a mixture of $GeO_2$ and $SiO_2$.

3. A thick film paste comprising finely divided particles of the glass of claim 1 dispersed in an organic medium comprising organic polymer dissolved in a volatilizable solvent.

4. A thick film paste comprising finely divided particles of a mixture of metal oxides stoichiometrically equivalent to the glass composition of claim 1.

5. The glass of claim 1 which has been partially crystallized by heating to a temperature of 500°–600° C.

* * * * *